United States Patent
Igarashi

(12) 
(10) Patent No.: US 6,348,710 B1
(45) Date of Patent: Feb. 19, 2002

(54) NON-VOLATILE SEMICONDUCTOR MEMORY DEVICE

(75) Inventor: Michito Igarashi, Tochigi (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/547,179

(22) Filed: Apr. 11, 2000

(30) Foreign Application Priority Data

May 21, 1999 (JP) .......................................... 11-141947

(51) Int. Cl.[7] .............................................. H01L 29/76
(52) U.S. Cl. ...................... 257/314; 257/315; 257/318
(58) Field of Search ................. 257/314, 315, 257/316, 317, 318, 320, 322; 438/201, 211, 257

(56) References Cited

U.S. PATENT DOCUMENTS

| | | | |
|---|---|---|---|
| 4,949,140 A | * 8/1990 | Tam | 257/316 |
| 5,029,230 A | 7/1991 | Yamauchi | 388/828 |
| 5,045,488 A | 9/1991 | Yeh | 437/43 |
| 5,067,108 A | 11/1991 | Jenq | 365/185 |
| 5,402,371 A | * 3/1995 | Ono | 365/185 |
| 6,121,088 A | * 9/2000 | Lin et al. | 438/264 |
| 6,157,058 A | * 12/2000 | Ogura | 257/315 |

FOREIGN PATENT DOCUMENTS

EP 0495492 A2 * 7/1992

* cited by examiner

*Primary Examiner*—Olik Chaudhuri
*Assistant Examiner*—Hoai Pham
(74) *Attorney, Agent, or Firm*—Fish & Richardson, P.C.

(57) ABSTRACT

A non-volatile semiconductor memory device is divided into a first region I and a second region II. In the first region, an n+ layer is formed to be enlarged from a source region 3 to beneath a floating gate 6. A p+ layer is formed in a channel region 4. The p+ layer serves to prevent a short channel effect from occurring during read of data. A capacitance coupling ratio C1/C2 between a control gate and the floating gate is preferably 0.8 or larger. In this configuration, the non-volatile semiconductor can write, erase and read data at a high speed using a low voltage.

15 Claims, 6 Drawing Sheets

NON-VOLATILE SEMICONDUCTOR MEMORY DEVICE

BACKGROUND OF THE INVENTION

1. Field of the Invention

The present invention relates to a non-volatile semiconductor memory device, and more particularly to a non-volatile semiconductor memory device which can write, erase and read data at a high speed and at a low voltage.

2. Description of the Related Art

With enlargement of an application field such as a portable telephone and digital still camera, an EEPROM (Electrically Erasable and Programmable Read Only Memory) has rapidly come into wide use. The EEPROM which permits electrical simultaneous erase of data is called a flash EEPROM.

The EEPROM is a non-volatile semiconductor memory device which stores digital information with two or more values according to whether or not a prescribed quantity of charges is stored and reads the digital information by a change in the conduction of a channel region corresponding to the quantity of charges.

The EEPROM is classified into a stacked-gate type and a split gate type. The split-gate type EEPROM is disclosed in e.g. U.S. Pat. Nos. 5,029,230, 5,045,488 and 5,067,108.

An arrangement of the split-gate type EEPROM cell is shown in FIGS. 5A and 5B. FIG. 5A is a plan view and FIG. 5B is a sectional view taken in line X—X in FIG. 5A.

As seen from these figures, a drain region 102 and a source region 103 are formed on a P-type semiconductor substrate 101 by a prescribed interval spaced apart from each other. A channel region 104 is formed therebetween. A floating gate 106 is formed on a gate insulating film 105 over a region extending from a part of the channel region 104 to a part of the source region 103. A thick oxide film 107 (hereinafter referred to as "minilocos") formed by selective oxidation is provided on the floating gate 106.

A tunnel oxide film 108 is formed to cover the side of the floating gate 106 and a part of the minilocos 107. A control gate 109 is formed from on the tunnel oxide film and a part of the channel region 104 to on a part of the drain region 102. On both sides of the EEPROM cell, element isolation oxide films 110 are formed so that it is electrically isolated from adjacent cells.

Now referring to FIGS. 6A–6C, an explanation will be given of the operation of the split-gate type EEPROM.

First, in write of data, as seen from FIG. 6A, prescribed voltages (e.g. 2 V for the control gate 109 and 10 V for the source region) are applied to the control gate 109 and source region 103) so that a current flows through the channel region 104. Thus, channel hot electrons (CHE's) are injected into and stored in the floating gate 106. The capacitance coupling ratio between the control gate 109 and the floating gate 106 is as low as about 0.2 so that the voltage applied to the source region 103 boosts the potential of the floating gate 106 to promote the injection of CHE's.

On the other hand, in erasure of data, as seen from FIG. 6B, with the drain region 102 and source region 103 connected to ground, a prescribed voltage (e.g. 13 V) is applied to the control gate 109 so that the electrons stored in the floating gate 106 are extracted as a Fowler-Nordheim tunneling current (FN tunnelling current) through the tunneling oxide film 108 to the control gate 109.

Further, in read of data, as shown in FIG. 6C, a prescribed voltage (e.g. 2 V) is applied to the control gate 109 and drain region 102. Then, a channel current corresponding to the quantity of charges stored in the floating gate 106 flows. By sensing the current, the data can be read.

The conventional split-gate type EEPROM described above has the following defects.

In the split-gate type EEPROM, a high electric field is produced in a gap between the control gate 109 and floating gate 106 so that the CHE's are accelerated. This provides an advantage of a short programming time (time required to write data). However, this provides a disadvantage requiring a high voltage for the write and erasure of data.

On the other hand, in a stacked gate type EEPROM in which a control gate is formed on and in alignment with the floating gate, generally, write of data is made by CHE tunneling or FN tunneling, and erasure of data is made by the FN tunneling from the floating gate to the source region. However, this provides a disadvantage of a long programming time.

SUMMARY OF THE INVENTION

An object of the present invention is to provide a non-volatile semiconductor memory device which can write and erase data at a high speed using a low voltage.

Each aspect of the invention described below is separately illustrative of the various embodiments of the invention and is not intended to be restrictive of the broad invention.

In order to attain the above object, in accordance with the first aspect of the invention, there is a non-volatile semiconductor memory device comprising:

a drain region and a source region each formed of a semiconductor layer having a second conduction type which are formed apart from each other on a semiconductor substrate having a first conduction type;

a floating gate formed on a first insulating film over the semiconductor substrate between the drain region and the source region;

a channel region formed in a surface of the semiconductor substrate between one end of the floating gate and the drain region;

a control gate formed on an upper face and side face of the floating gate and the channel over a second insulating film; and a semiconductor layer having the second conduction type enlarged from the source region to beneath the floating gate.

In accordance with this configuration, since the semiconductor layer having the second conduction type enlarged to beneath the floating gate is formed, a facing area between the source region and floating gate is increased. Therefore, the FN tunneling current flowing through the first insulating film is increased. As a result, write and erasure of data can be made within a short time.

In accordance with the second aspect of the invention, the non-volatile semiconductor memory device according to the first aspect is characterized in that the semiconductor layer having the second conduction type is a region enlarged from the source region to the drain side direction of the floating gate in the surface of the channel region.

In this configuration, the semiconductor layer having the second conduction type is enlarged from the source region to the drain side of the floating gate. Therefore, a facing area between the semiconductor layer and the floating gate can be maximized so that write and erasure of data can be made within a short time.

In accordance with the third aspect of the invention, the non-volatile semiconductor memory device according to the first aspect is characterized in that the semiconductor layer having the second conduction type is a region formed from the source region to reach the vicinity of the end of the floating gate on its drain side. In this configuration, since drain diffusion is made to reach the end position of the channel region beneath the floating gate semiconductor layer having the second conduction type, the facing area between the semiconductor layer and the floating gate can be maximized so that write and erasure of data can be made within a short time.

In accordance with the fourth aspect of the invention, the non-volatile semiconductor memory device according to the first invention is characterized in that the semiconductor layer having the second conduction type is a highly doped impurity region formed so as to generate tunneling between the semiconductor layer and the floating gate during write of data.

In accordance with the fifth aspect of the invention, the non-volatile semiconductor memory device according to any one of the first to the fourth aspect is characterized in that it further comprises a semiconductor layer having the first conduction type formed in the channel region.

In this configuration, although a short channel effect may occur because the channel length is shortened due to the provision of the semiconductor layer having the second conduction type, provision of the semiconductor layer having the first conduction type is arranged in the channel region so that occurrence of the short channel effect can be prevented.

In accordance with the sixth aspect of the invention, the non-volatile semiconductor memory device according to the first aspect is characterized in that the semiconductor layer is a region formed from the source region to reach the vicinity of the end of the floating gate on its drain side in a full width direction of the channel region.

In this configuration, since the source region is enlarged in a full width direction of the channel region, the facing area between the source region and the floating gate can be increased so that write and erasure of data can be made within a short time. Even where the source region is enlarged partially beneath the floating gate, the time required for write and erasure of data can be shortened.

In accordance with the seventh aspect of the invention, the non-volatile semiconductor memory device according to the first aspect is characterized that the semiconductor layer is a region formed from the source region to reach the vicinity of the end of the floating gate on its drain side partially in a width direction of the channel region, and the source region is formed so that the remaining region of the channel region faces only a part of the floating gate.

In this configuration, a partial area of the channel region is used to increase the area facing the floating gate to shorten the time of write and erasure of data and the remaining area is used as a region for making read of data easy. As a result, the increase in a read voltage is prevented whereas the time required for write and erasure of data can be shortened.

In accordance with the eighth aspect of the invention, the non-volatile semiconductor memory device according to the first aspect is characterized in that it further comprises a semiconductor layer having the first conduction type formed between the semiconductor layer having the second conduction type and the drain region.

In this configuration, because the channel length is shortened due to the provision of the semiconductor layer having the second conduction type, provision of the semiconductor layer having the first conduction type is arranged in the channel region so that occurrence of the short channel effect can be prevented.

In accordance with the ninth aspect of the invention, there is provided a non-volatile semiconductor memory device comprising a drain region and a source region each having a second conduction type which are formed apart from each other on a semiconductor substrate having a first conduction type; a channel region formed between the drain region and the source region; a floating gate formed through a first insulating film on the semiconductor substrate between the drain region and the source region; and a control gate formed on the floating gate through a second insulating film, wherein the non-volatile semiconductor memory device is divided into a first region and a second region in a width direction of the channel region; and the first region includes a semiconductor layer having the second conduction type enlarged from the source region to beneath the floating gate, and another semiconductor layer having the first conduction type formed in the channel region.

In accordance with this configuration, in the first region, since the semiconductor layer having the second conduction type enlarged to beneath the floating gate is formed, a facing area between the source region and floating gate is increased. Therefore, the FN tunneling current flowing through the first insulating film is increased. By using this first region, write and erasure of data can be made within a short time. Further, in the first region, since the second conduction layer having the first conduction type is formed, the threshold voltage in this region is increased. This makes it difficult to read data using a low voltage. In order to obviate such an inconvenience, the second region (split-gate type EEPROM according to the prior art) is used to permit the data to be read.

In accordance with the tenth aspect of the invention, the non-volatile semiconductor memory device according to the fifth aspect is characterized in that a capacitance coupling ratio between the control gate and the floating gate is preferably 0.8 or larger. This decreases a potential difference between the control gate and floating gate during the write/erasure of data and increases the potential difference between the floating gate and the semiconductor layer having the second conduction type beneath it. Thus, since the FN tunneling current, the write/erasure of data can be effectively done using a low voltage, and deterioration of the read current is also prevented.

In accordance with the eleventh aspect of the invention, the non-volatile semiconductor memory device according to the first aspect is characterized in that film thicknesses of the first insulating film and the second insulating film are controlled so that a capacitance between the control gate and floating gate is equal to or larger than between the floating gate and the semiconductor layer having the second conduction type.

In this configuration, by adjusting the film thickness of each of the first and the second gate insulating film is adjusted to adjust the capacitance ratio so that write and erasure of data can be made at a low voltage.

In accordance with the twelfth aspect of the invention, the non-volatile semiconductor memory device according to the second aspect is characterized in that the control gate covers an entire surface of the floating gate through the insulating film.

Therefore, the capacitance coupling ration between the control gate and the floating gate is enhanced. This decreases a potential difference between the control gate and floating gate during the write/erasure of data and increases the potential difference between the floating gate and the first conductive layer having the second conduction type beneath it. Thus, the same effect as above can be obtained.

In accordance with the thirteenth aspect of the invention, the non-volatile semiconductor memory device according to the first aspect is characterized in that the semiconductor layer having the first conduction type is more deeply formed than a bottom of the semiconductor layer having the second conduction type is.

In this configuration, the short channel effect can be surely suppressed.

The above and other objects and features of the present invention will be more apparent from the following description taken in conjunction with the accompanying drawings.

DESCRIPTION OF THE PREFERRED EMBODIMENTS

Figure 1A:
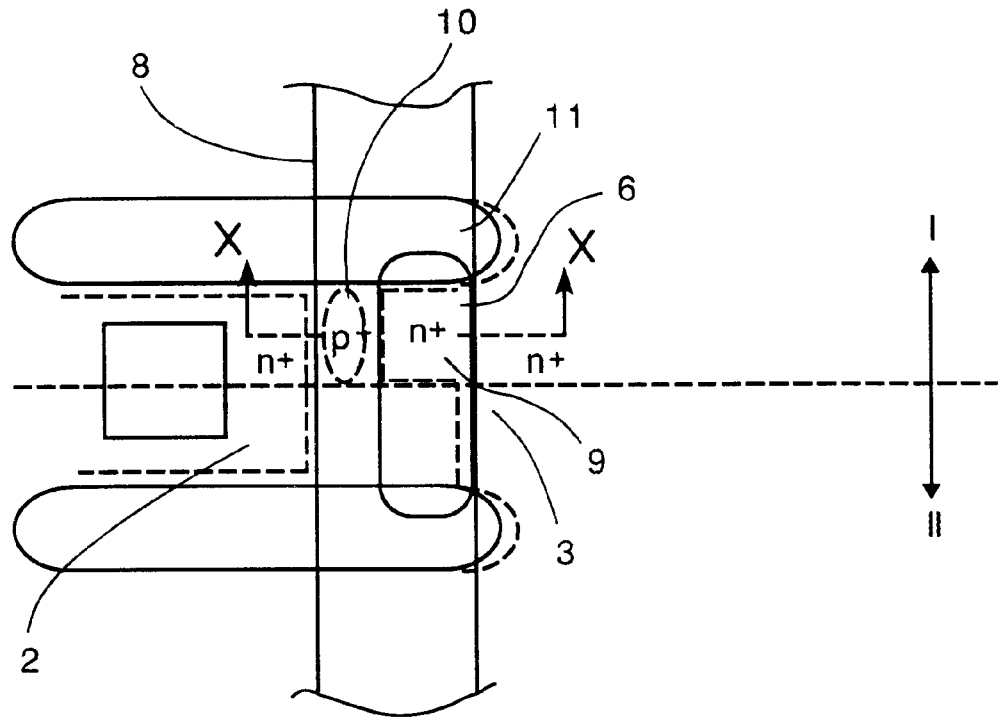
FIGS. 1A are 1B are a plan view of an arrangement of the non-volatile semiconductor memory device according to an embodiment of the present invention and a sectional view taken in line X—X in FIG. 1A, respectively.
Figure 1B:
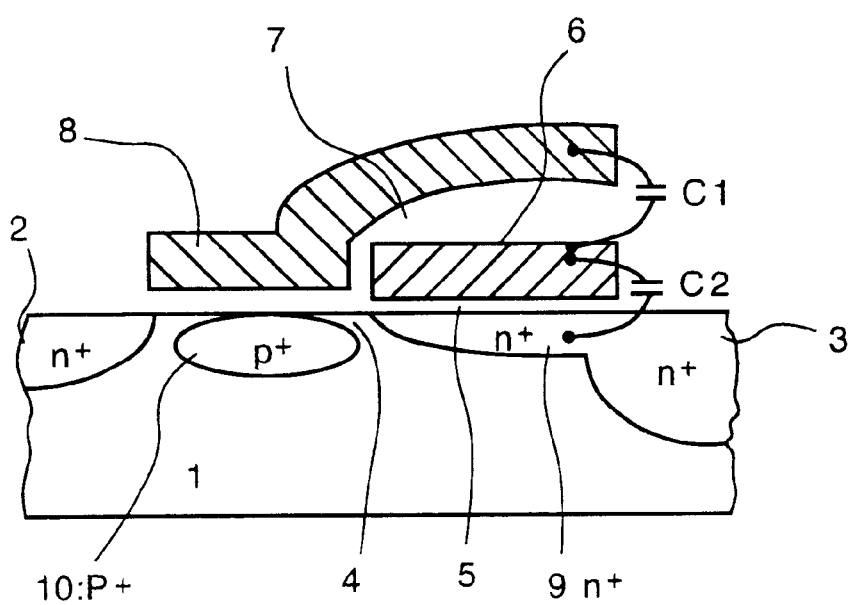

Now referring to drawings, an explanation will be given of an embodiment of the present invention. FIGS. 1A are 1B show an arrangement of the non-volatile semiconductor memory device according to an embodiment of the present invention. FIG. 1A is a plan view thereof and FIG. 1B is a sectional view taken in line X—X in FIG. 1A.

As seen from FIG. 1A, the non-volatile semiconductor memory device (EEPROM cell) has a first region I and a second region II. A source region 3 and a drain region 2 are formed apart from each other on the surface of a P-type semiconductor substrate 1. The EEPROM cell is divided into the first region I and the second region II in a width direction of the channel region 4 between the source region 3 and the drain region 2. In FIG. 1A, the EEPROM region on the upper side from a broken line is the first region I and that on the lower side from the broken line is the second region II. FIG. 1B shows a section of the first region I.

The structure of the first region I will be explained below. A floating gate 6 is formed through the first insulating film 5 on the semiconductor substrate 1 between the drain region 2 and source region 3. The channel region 4 is located on the surface of the semiconductor substrate between one end of the floating gate 6 and drain region 2. A control gate 8 is formed through a second insulating film 7 above and side of the floating gate and above the channel region 4.

An n+ layer 9 is formed so as to enlarge from the source region 3 to beneath the floating gate 6. In order to increase the FN current from the floating gate 6, the n+ layer 9 is preferably formed beneath the entire floating gate 6. The n+ layer 9 can be formed by ion-implanting n-type impurities such as arsenic (As) before the floating gate 6 is formed.

On the other hand, a p+ layer 10 is formed in the channel region 4. The p+ layer serves to prevent a short-channel effect during read of data. The p+ layer 10 can be formed by ion-implanting p-type impurities such as BF2 and B. In order to prevent the short channel effect, channel doping is preferably made to a relatively deep channel position.

The capacitance coupling ratio C1/C2 between the control gate 8 and the floating gate 6 is preferably set at 0.8 or more. Now, C1 refers to coupling capacitance between the control gate 8 and floating gate 6 and C2 refers to coupling capacitance between the floating gate 6 and the n+ layer 9.

This intends to enhance the capacitance coupling between the control gate 8 and the floating gate 6 and increase the FN tunneling current flowing between the floating gate 6 and the n+ layer 9 so that write and erasure of data can be effectively carried out using a low voltage.

It should be noted that the capacitance coupling ratio between the control gate 8 and the floating gate 6 can be increased by adjusting the film thickness of each of the first insulating film 5 and the second insulating film 7. Further, the entire surface of the floating gate 6 may be covered with the control gate 8.

On the other hand, the second region II, which has the same structure of the conventional split-gate type EEPROM cell, will not be explained here. However, it should be noted that the capacitance coupling has been enhanced between the control gate 8 and the floating gate 6.

Figure 2A:
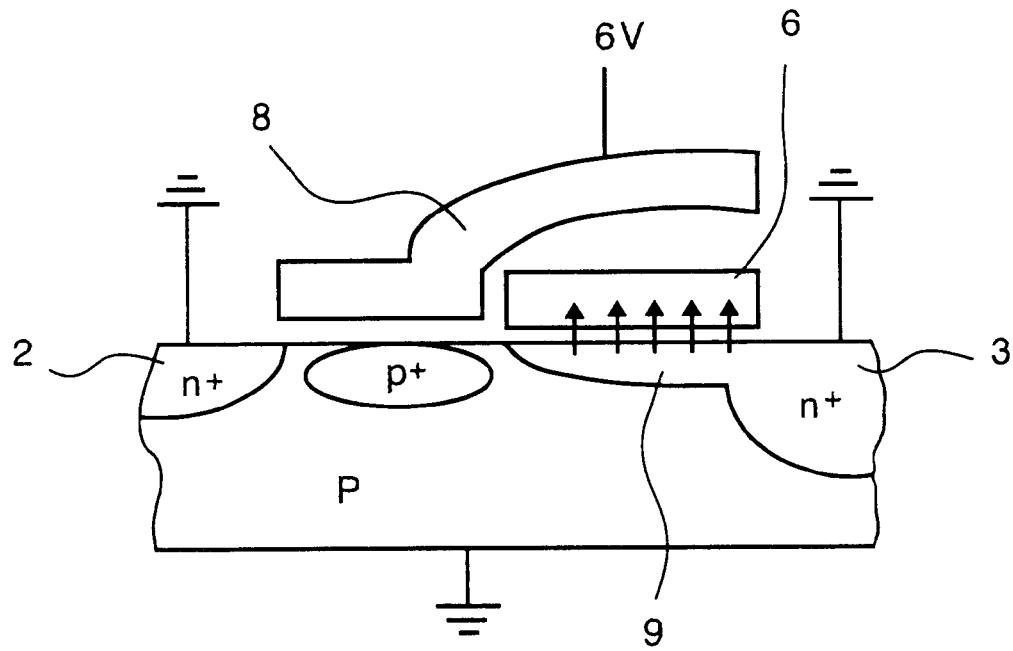
FIGS. 2A and 2B are views for explaining a method of write for a non-volatile semiconductor memory device according to this embodiment of the present invention, respectively.
Figure 2B:
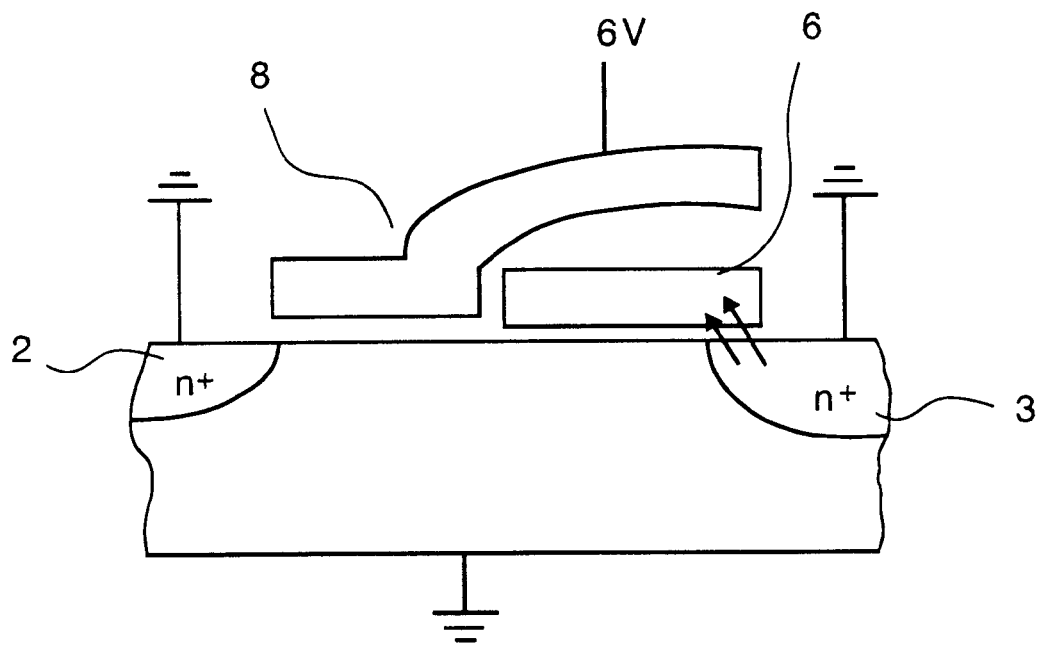

FIGS. 2A and 2B are views for explaining a method of write for a non-volatile semiconductor memory device according to this embodiment of the present invention.

In write of data, with the drain region 2 and source region 3 connected to ground, a voltage of about 6 V is applied to the control gate 6. Then, as seen from FIG. 2A, in the first region I, the FN tunneling current flows from the n+ layer 9 to the floating gate 6 so that electrons are stored in the floating gate 6. This is a main mechanism of write which is called "main injection". In this embodiment, the n+ layer 9 is formed beneath the entire floating gate so that a large amount of the FN tunneling current flows. As a result, as compared with the conventional stacked-gate type EEPROM, the programming time can be shortened.

In addition, as a result that the large amount of the FN tunneling current flows, unlike the split-gate type EEPROM, a high voltage (12 V) is not required. Further, as seen from FIG. 2B, in the second region II, the n+ layer 9 is not formed so that the FN tunneling current flows from the source region 3 to the floating gate 6 so that the electrons are stored in the floating gate 6. This FN tunneling current, which is smaller than the current for the main injection, is called "sub-injection".

Figure 3A:
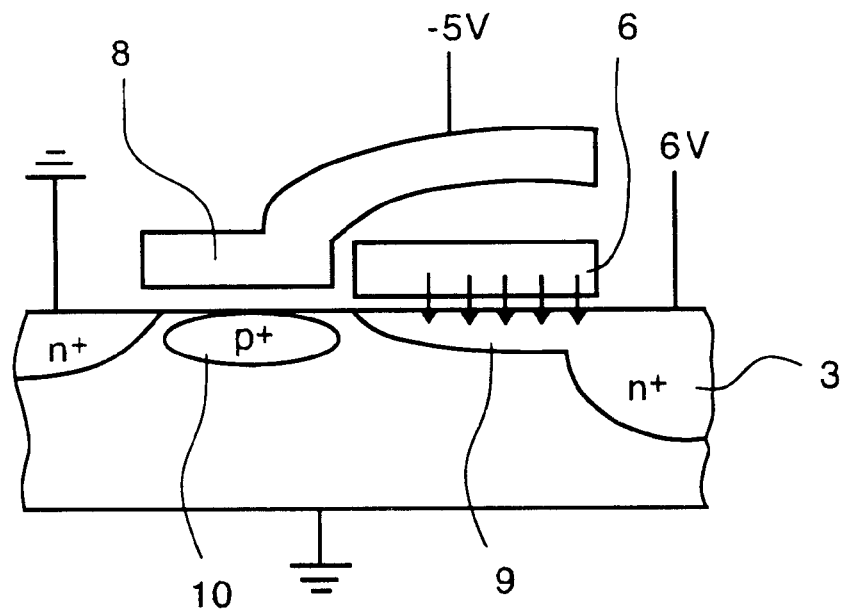
FIGS. 3A and 3B are views for explaining a method of erasure for a non-volatile semiconductor memory device according to this embodiment of the present invention, respectively.
Figure 3B:
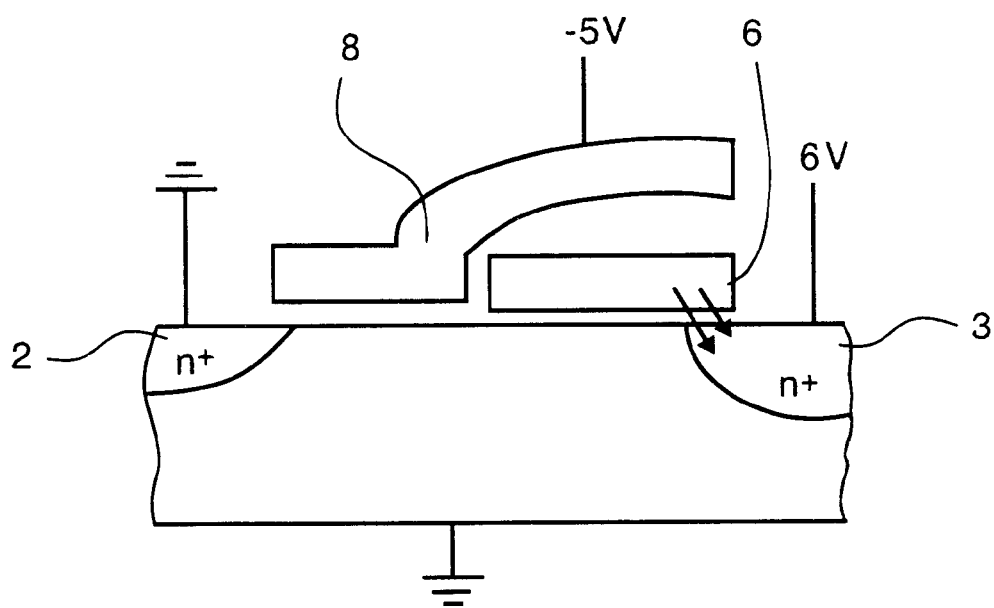

FIGS. 3A and 3B are views for explaining a method of erasure for a non-volatile semiconductor memory device according to this embodiment of the present invention.

In erasure of data, with the drain region 2 connected to ground, a voltage of about—5 V is applied to the control gate 6, and a voltage of about 6 V is applied to the drain region 2. Then, as seen from FIG. 3A, in the first region I, the FN tunneling current flows from the floating gate 6 to the n+ layer 9. Thus, the electrons stored in the floating gate 6 are extracted through the n+ layer 9 to the source region 3. This is main erasure mechanism, which is called "main erasure".

In this embodiment, the capacitor coupling between the control gate 8 and the floating gate 6 is increased, a negative bias is applied to the control gate 9 and a positive bias is applied to the source region 3. In this manner, the erasure of data can be realized by a low voltage. Further, the n+ layer 9 is formed beneath the entire floating gate so that a large amount of the FN tunneling current flows, thereby shortening the time for erasure.

Further, as seen from FIG. 3B, in the second region II, the n+ layer 9 is not formed so that the FN tunneling current flows directly from the source region 3 to the floating gate 6 so that the electrons are stored in the floating gate 6. This FN tunneling current, which is smaller than the current for the main erasure, is called "sub-erasure".

Figure 4A:
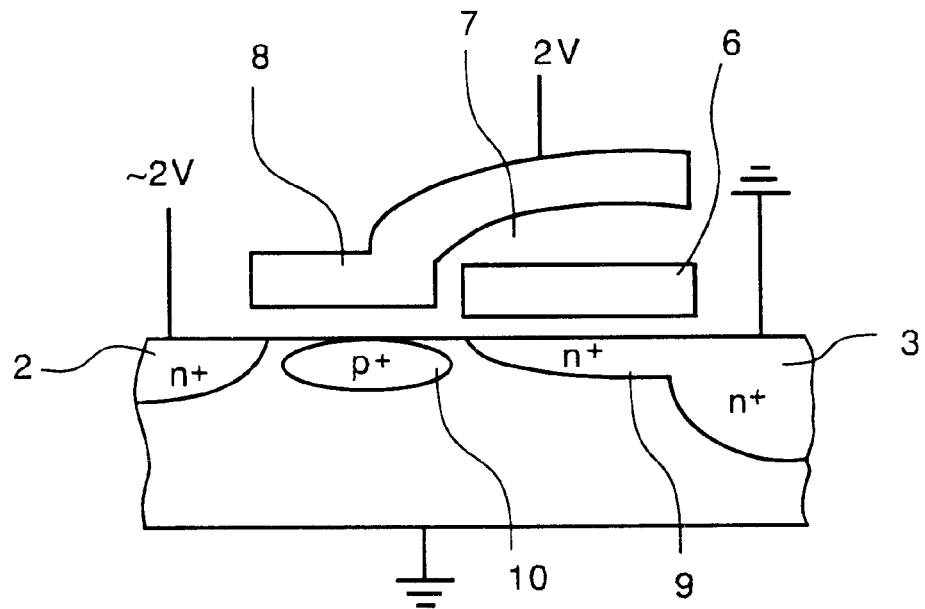
FIGS. 4A and 4B are views for explaining a method of read for a non-volatile semiconductor memory device according to this embodiment of the present invention, respectively.
Figure 4B:
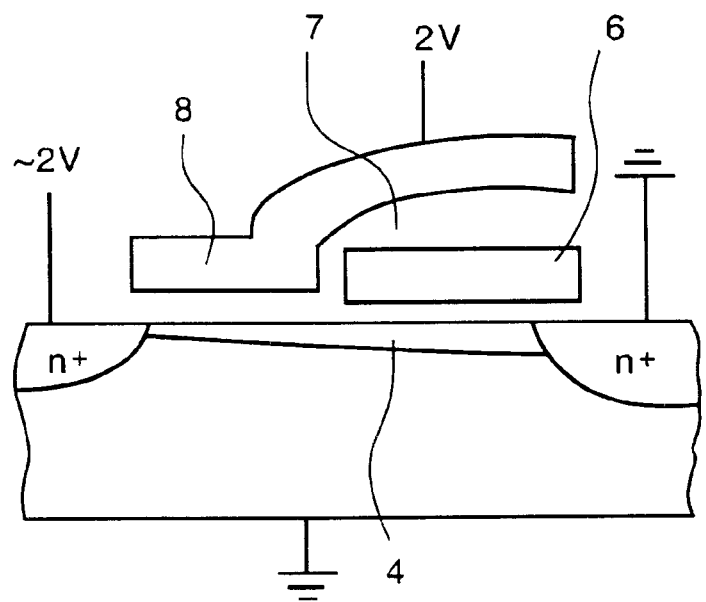
Figure 5A:
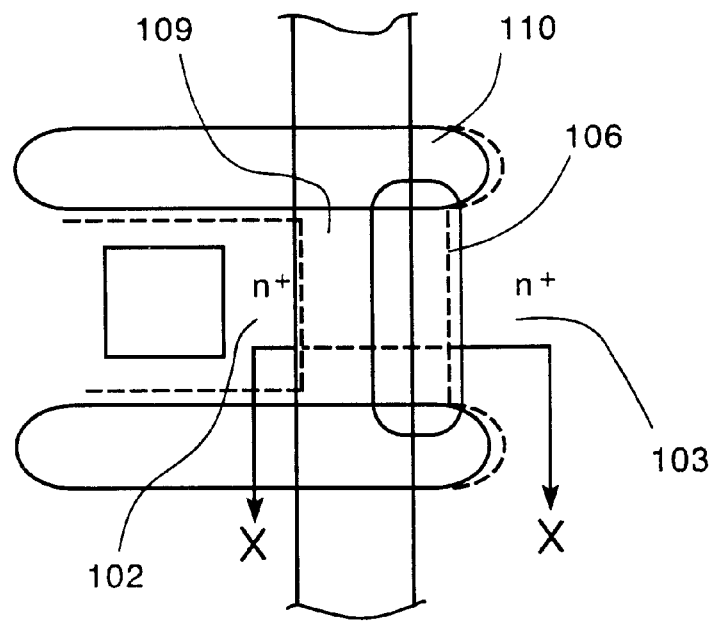
FIGS. 5A and 5B are a plan view showing an arrangement of the split-gate type EEPROM cell and a sectional view taken in line X—X in FIG. 5A, respectively.
Figure 5B:
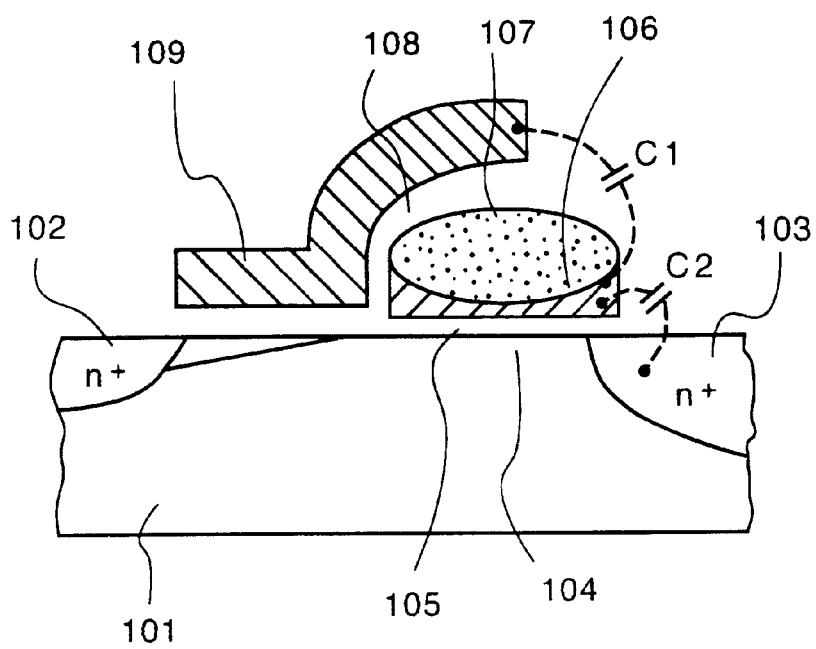
Figure 6A:
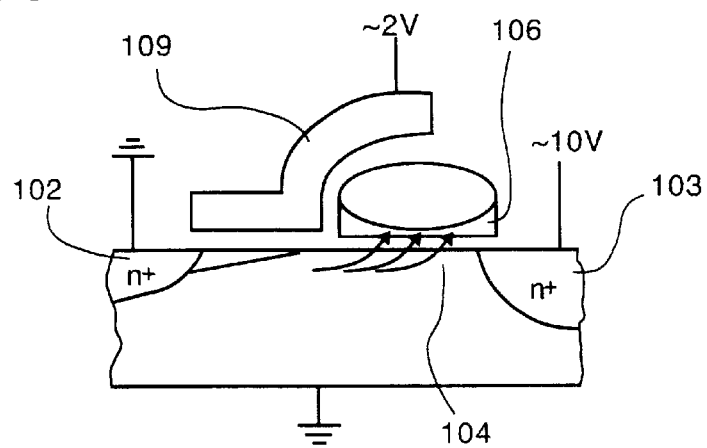
FIGS. 6A, 6B and 6C are views for explaining methods of write, erasure and read for a split-gate type EEPROM, respectively.
Figure 6B:
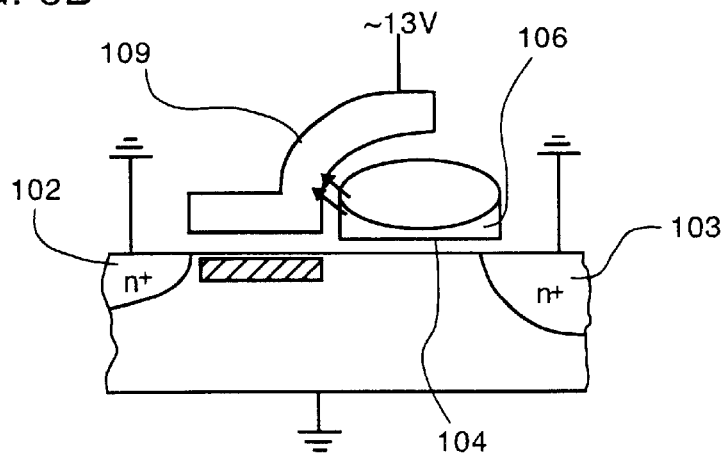
Figure 6C:
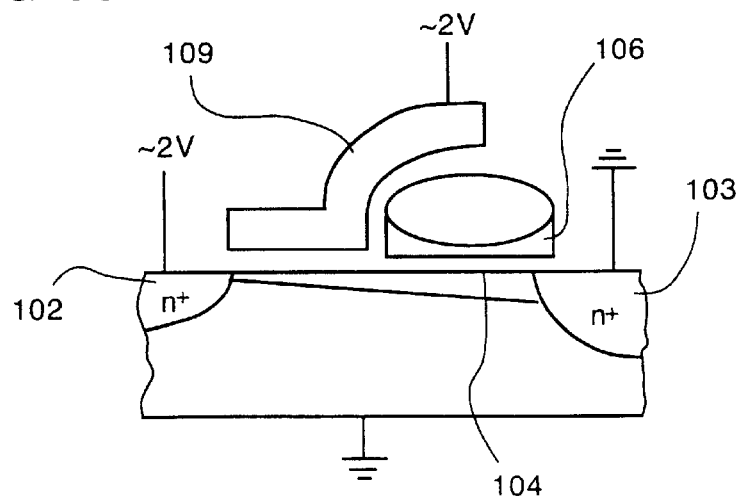

FIGS. 4A and 4B are views for explaining a method of read for a non-volatile semiconductor memory device according to this embodiment of the present invention.

In erasure of read, with the source region 3 connected to ground, a voltage of about 2 V is applied to the control gate 6 and drain region 2. In the first region I, as seen from FIG. 4, the channel region is short because of the presence of the n+ layer 9. Therefore, in order to prevent erroneous read due to the short channel effect, the p+ layer 10 is formed in the channel region. However, provision of the p+ layer 10 increases the threshold voltage viewed from the control gate 8. Therefore, the channel is not inverted by a low voltage of 2 V or so, thereby making it difficult to read the data in the first region I.

On the other hand, as seen from FIG. 4B, in the second region II with the p+ layer 10 not formed, which has the same structure as the conventional split-gate type EEPROM cell, can make the read of data.

Further, since the channel width is divided into the first region I and second region II, there is a fear of reduction in the read current. However, since the second insulating film is made thin in order to increase the coupling capacitance C1 between the control gate 8 and the floating gate 6, a potential difference between the floating gate 6 and n+ layer 9 beneath it is increased. As a result, the on-resistance of the channel region 4 is decreased, thereby sufficiently compensating for the read-out current.

The size ratio between the first region and the second region can be optionally selected. The n+ layer 9 in the first region may not be formed beneath the entire floating gate 6, but may be changed according to an acquired characteristic.

In the above embodiment, the semiconductor memory device is divided into the first and the second regions. However, the enlarged n+ layer 9 may be formed wholly or partially in the width direction of the channel region.

What is claimed is:

1. A non-volatile semiconductor memory device comprising:

a drain region and a source region of a second conduction type, formed apart from each other on a semiconductor substrate of a first conduction type;

a floating gate formed on a first insulating film over the semiconductor substrate between the drain region and the source region;

a semiconductor layer of a second conduction type being beneath the floating gate and extending over an entire width of the floating gate from said source region;

a channel region formed in said semiconductor substrate between said semiconductor layer and said drain region; and a control gate formed above said floating gate and above said channel through a second insulating film.

2. The non-volatile semiconductor memory device according to claim 1, wherein said semiconductor layer having the second conduction type comprises a region extending from the source region to the drain side of the channel region, the region being beneath said floating gate.

3. The non-volatile semiconductor memory device according to claim 1, wherein said semiconductor layer having the second conduction type comprises a region extending from said source region to reach the vicinity of the end of the channel region.

4. The non-volatile semiconductor memory device according to claim 1, wherein said semiconductor layer having the second conduction type comprises a highly doped impurity region formed to generate tunneling between it and said floating gate during write operation of data.

5. The non-volatile semiconductor memory device according to any one of claims 1 to 4, further comprising a semiconductor layer having the first conduction type formed in said channel region.

6. The non-volatile semiconductor memory device according to claim 5, wherein a ratio of a first capacitance, which is between said control gate and said floating gate, to a second capacitance, which is between said floating fate and the semiconductor layer of a second conduction type, is 0.8 or larger.

7. The non-volatile semiconductor memory device according to claim 1, wherein said semiconductor layer comprises a region extending from said source region to reach the vicinity of the end of the channel region, said region being beneath said floating gate on its drain side in a full width direction of said channel region.

8. The non-volatile semiconductor memory device according to claim 1, wherein said semiconductor layer comprises a region extending from said source region to reach the vicinity of the end of channel region, said region being beneath said floating gate on its drain side partially in a width direction of said channel region, and said source region is formed so that the remaining region of said channel region faces only a part of said floating gate.

9. The non-volatile semiconductor memory device according to claim 1, further comprising a semiconductor layer of a first conduction type formed between said semiconductor layer of the second conduction type and said drain region.

10. The non-volatile semiconductor memory device according to claim 1, wherein film thicknesses of said first insulating film and said second insulating film are controlled so that a capacitance between said control gate and floating gate is equal to or larger than between said floating gate and the semiconductor layer having the second conduction type.

11. The non-volatile semiconductor memory device according to claim 1, wherein said control gate covers an entire surface of said floating gate through said second insulating film.

12. The non-volatile semiconductor memory device according to claim 1, wherein the semiconductor layer having the first conduction type is more deeply formed than a bottom of the semiconductor layer having the second conduction type.

13. The non-volatile semiconductor memory device according to claim 1, wherein the semiconductor layer of a second conduction type is implanted with arsenic.

14. The non-volatile semiconductor memory device according to claim 1, wherein electrons are stored in the floating gate by an FN tunneling current during a write operation data.

15. A non-volatile semiconductor memory device comprising:
- a first region and a second region disposed next to the first region, said first region including:
  - a drain region and a source region of a second conduction type, formed apart from each other on a semiconductor substrate of a first conduction type;
  - a channel region formed between said drain region and said source region, said channel region including a layer made of a first conduction type;
  - a floating gate formed through a first insulating film on said semiconductor substrate between said drain region and said source region; and
  - a control gate formed above said floating gate and above said channel region through a second insulating film; wherein
  said first region includes a semiconductor layer of a second conduction type being beneath said floating gate and extending over an entire width of the floating gate from said source region; and
- said second region including:
  - a drain region, a source region, a floating gate, and a control gate configured similarly as the first region but without a channel region of a first conduction type or a semiconductor layer of a second conduction type extending fully beneath the floating gate from the source region.

* * * * *